(12) United States Patent
Yoo et al.

(10) Patent No.: US 9,905,434 B2
(45) Date of Patent: Feb. 27, 2018

(54) METHOD FOR FABRICATING ARRAY SUBSTRATE, ARRAY SUBSTRATE AND DISPLAY DEVICE

(71) Applicant: BOE TECHNOLOGY GROUP CO., LTD., Beijing (CN)

(72) Inventors: Seongyeol Yoo, Beijing (CN); Seungjin Choi, Beijing (CN); Youngsuk Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/022,288

(22) PCT Filed: Aug. 17, 2015

(86) PCT No.: PCT/CN2015/087308
§ 371 (c)(1),
(2) Date: Mar. 16, 2016

(87) PCT Pub. No.: WO2016/169162
PCT Pub. Date: Oct. 27, 2016

(65) Prior Publication Data
US 2017/0062239 A1    Mar. 2, 2017

(30) Foreign Application Priority Data

Apr. 24, 2015    (CN) .......................... 2015 1 0198896

(51) Int. Cl.
*H01L 21/00*    (2006.01)
*H01L 21/16*    (2006.01)
(Continued)

(52) U.S. Cl.
CPC .............. *H01L 21/44* (2013.01); *H01L 21/77* (2013.01); *H01L 27/1225* (2013.01);
(Continued)

(58) Field of Classification Search
CPC ............. H01L 29/66765; H01L 29/458; H01L 29/66757; H01L 27/1104; H01L 27/0203; H01L 27/088; H01L 27/1225
See application file for complete search history.

(56) References Cited

U.S. PATENT DOCUMENTS 5,976,902 A * 11/1999 Shih .................. H01L 29/66757
257/59
6,180,469 B1    1/2001 Pramanick et al.
(Continued)

FOREIGN PATENT DOCUMENTS

CN    1786801    6/2006
CN    1786801 A    6/2006
(Continued)

OTHER PUBLICATIONS

International Search Report and Written Opinion from PCT/CN15/087208 dated Jan. 11, 2016.
(Continued)

*Primary Examiner* — Zandra Smith
*Assistant Examiner* — John M Parker
(74) *Attorney, Agent, or Firm* — Calfee, Halter & Griswald LLP

(57) ABSTRACT

The invention relates to a method for fabricating an array substrate, an array substrate and a display device. The method for fabricating an array substrate may comprise: forming a metal thin film layer for a source electrode, a drain electrode and a data line; forming a non-crystalline semiconductor thin film layer on the metal thin film layer; and performing annealing, so as to at least partly convert the non-crystalline semiconductor thin film layer into a metal semiconductor compound. By at least partly converting the non-crystalline semiconductor thin film layer into a metal semiconductor compound, the resulting metal semiconductor compound may prevent oxidative-corrosion of the metal
(Continued)

thin film layer, such as a low-resistance metal (e.g., Cu or Ti) layer, in the subsequent procedures, which is favorable for the fabrication of a metal oxide thin film transistor using Cu or Ti.

16 Claims, 2 Drawing Sheets

(51) Int. Cl.
    *H01L 21/44*     (2006.01)
    *H01L 21/77*     (2017.01)
    *H01L 27/12*     (2006.01)
    *H01L 29/45*     (2006.01)
    *H01L 29/66*     (2006.01)
    *H01L 29/786*     (2006.01)

(52) U.S. Cl.
    CPC ........ *H01L 29/45* (2013.01); *H01L 29/66969* (2013.01); *H01L 29/7869* (2013.01); *H01L 29/458* (2013.01)

(56) References Cited

U.S. PATENT DOCUMENTS

| | | | |
|---|---|---|---|
| 6,803,296 B2 | 10/2004 | Miyairi | |
| 2002/0001892 A1* | 1/2002 | Kim | H01L 21/28079 438/197 |
| 2002/0085135 A1* | 7/2002 | Kim | G02F 1/1362 349/40 |
| 2002/0115231 A1* | 8/2002 | Lane | H01L 28/60 438/60 |
| 2006/0118793 A1* | 6/2006 | Yang | H01L 29/458 257/79 |
| 2006/0205125 A1* | 9/2006 | Bae | H01L 29/458 438/149 |
| 2009/0098673 A1* | 4/2009 | Yang | H01L 29/458 438/29 |
| 2011/0108830 A1* | 5/2011 | Park | H01L 29/7869 257/43 |

FOREIGN PATENT DOCUMENTS

| | | |
|---|---|---|
| CN | 101123271 | 2/2008 |
| CN | 102890360 | 1/2013 |
| CN | 103021959 | 4/2013 |
| JP | 2003051446 | 2/2003 |
| JP | 20030513446 | 2/2003 |

OTHER PUBLICATIONS

First Office Action for Chinese Patent Application No. 201510198896.3 dated May 18, 2017.

* cited by examiner

US 9,905,434 B2

METHOD FOR FABRICATING ARRAY SUBSTRATE, ARRAY SUBSTRATE AND DISPLAY DEVICE

RELATED APPLICATIONS

The present application is the U.S. national phase entry of PCT/CN2015/087208, with an international filling date of Aug. 17, 2015, which claims the benefit of Chinese Patent Application NO. 201510198896.3, filed on Apr. 24, 2015, the entire disclosure of which are incorporated herein by reference.

FIELD OF THE INVENTION

The invention relates to the field of display, in particular, to a method for fabricating an array substrate, an array substrate fabricated using such method, and a display device comprising the array substrate.

BACKGROUND OF THE INVENTION

During an existing process for fabricating thin film transistors for display devices, electrodes (e.g., a gate, a source electrode and a drain electrode) or electrode leads (e.g., gate lines and data lines) usually require the application of low-resistance metals (e.g., Cu, etc.). However, in the circumstances where such metals are used, there is a problem that the metals are restricted in many procedures due to the corrosion of metal surfaces caused by oxidation. In other words, as the metal surfaces have the phenomenon of corrosion caused by oxidation, usage of such metals is restricted in many procedures.

Accordingly, there is an urgent need in the prior art to develop a new technique to prevent the corrosion of metal electrode surfaces caused by oxidation during the processes for fabricating the display devices comprising thin film transistors.

SUMMARY OF THE INVENTION

In view of this, embodiments of the invention provide a method for fabricating an array substrate, an array substrate fabricated by using such method, and a display device comprising the array substrate, which can overcome or at least alleviate some of the deficiencies existing in the prior art.

In an aspect, a method for fabricating an array substrate is provided. The method may include the following steps: forming a metal thin film layer for a source electrode, a drain electrode and a data line; forming a non-crystalline semiconductor thin film layer on the metal thin film layer; and performing annealing, so as to at least partly convert the non-crystalline semiconductor thin film layer into a metal semiconductor compound.

With the method for fabricating an array substrate provided by an embodiment of the invention, by at least partly converting the non-crystalline semiconductor thin film layer into a metal semiconductor compound, the resulting metal semiconductor compound may prevent oxidative-corrosion of the surface of the metal thin film layer, such as a low-resistance metal Cu layer, in the subsequent procedures. By means of such method, metal oxide thin film transistors such as indium gallium zinc oxide InGaZnO (IGZO), indium tin zinc oxide InSnZnO (ITZO) and nitrogen-doped zinc oxide ZnON may be fabricated, and also the oxidation of Cu or Ti at the source electrode or drain electrode can be prevented during the fabrication procedure of the thin film transistor using low-resistance metals such as Cu.

In an embodiment of the invention, the method for fabricating an array substrate may also include the following steps: forming a photoresist layer; removing the photoresist outside regions of the source electrode, drain electrode and data line by exposure and development; removing the metal semiconductor compound outside the regions of the source electrode, drain electrode and data line by dry etching; removing the metal thin film layer outside the regions of the source electrode, drain electrode and data line by wet etching; and then removing a remaining photoresist.

In another embodiment of the invention, the method for fabricating an array substrate may also include the following step: prior to forming the metal thin film layer for the source electrode, the drain electrode and the data line, forming on the substrate a gate and a gate line, a gate insulation layer covering the gate and gate line, and an active layer on the gate insulation layer and corresponding to a region of the gate.

In yet another embodiment of the invention, the method for fabricating an array substrate may also include the following steps: forming a passivation layer, and etching portions of the passivation layer corresponding to the drain electrode, gate line and data line to form corresponding through-holes.

In another embodiment of the invention, the method for fabricating an array substrate may also include the following step: forming a via-hole of the gate insulation layer at a position corresponding to the gate line on the gate insulation layer.

In another embodiment of the invention, the method for fabricating an array substrate may also include the following steps: forming a transparent conductive thin film and forming a pattern including a pixel electrode, a connection line for the gate line and a connection line for the data line on the passivation layer with the through-holes through a patterning process, and a metal semiconductor compound on the drain electrode is electrically connected to the pixel electrode by means of the through-hole corresponding to the drain electrode.

In an embodiment of the invention, the metal thin film layer may comprise a copper or titanium layer.

In another embodiment of the invention, the non-crystalline semiconductor thin film layer may comprise a layer of α-silicon, α-germanium, α-gallium arsenide, α-arsenic sulfide or α-selenium.

In yet another embodiment of the invention, the metal semiconductor compound may comprise a silicide of copper, a germanide of copper, a compound of copper and α-gallium arsenide, a compound of copper and α-arsenic sulfide, a compound of copper and α-selenium, a silicide of titanium, a germanide of titanium, a compound of titanium and α-gallium arsenide, a compound of titanium and α-arsenic sulfide, or a compound of titanium and α-selenium. Further, the metal thin film layer may comprise a copper layer.

In another embodiment of the invention, the non-crystalline semiconductor thin film layer may comprise an α-silicon layer.

In an embodiment of the invention, the metal semiconductor compound may comprise a silicide of copper.

In an embodiment of the invention, the thickness of the non-crystalline semiconductor thin film layer may be 10 Å-50 Å.

In another embodiment of the invention, a temperature for the annealing may range between 200° C. and 280° C.

In another embodiment of the invention, the annealing may be performed under nitrogen atmosphere.

In an embodiment of the invention, the active layer may be a metal oxide layer. The metal oxide layer may comprise a semiconductor layer of InGaZnO, InSnZnO or ZnON.

According to a second aspect, an array substrate fabricated by using the above mentioned method for fabricating an array substrate is provided.

For the array substrate fabricated by using the above mentioned method for fabricating an array substrate, non-crystalline semiconductor thin film layer may be at least partly converted into a metal semiconductor compound, in this way, the resulting metal semiconductor compound may prevent oxidative-corrosion for the surface of the metal thin film layer, such as a low-resistance metal (e.g., Cu) layer, in the subsequent procedures. For the array substrate fabricated by using above method, metal oxide thin film transistors such as indium gallium zinc oxide InGaZnO (IGZO) thin film transistors, indium tin zinc oxide InSnZnO (ITZO) thin film transistors and nitrogen-doped zinc oxide ZnON thin film transistors may be fabricated, and also the oxidation of the low-resistance metal (e.g., Cu) at the source electrode or drain electrode can be prevented during the fabrication procedure of the thin film transistor using the low-resistance metal.

According to a third aspect, a display device comprising the abovementioned array substrate is provided.

DETAILED DESCRIPTION OF THE INVENTION

Embodiments of the invention will be described in detail below with reference to FIGS. 1-11 of the application. The following reference numbers will be used throughout the figures:

REFERENCE SIGNS

12: a substrate; 14: a gate; 16: a gate line; 18: a gate insulation layer;
20: an active layer; 22: a metal thin film layer;
24: a non-crystalline semiconductor thin film layer;
26: a metal semiconductor compound layer;
28a: photoresist corresponding to the source electrode;
28b: photoresist corresponding to the drain electrode;
28c: photoresist corresponding to a region of the data line;
22a: a source electrode; 22b: a drain electrode; 22c: a data line;
26a: a source metal semiconductor compound layer;
26b: a drain metal semiconductor compound layer;
26c: a metal semiconductor compound layer for the data line;
30: a passivation layer;
32a: a through-hole corresponding to the drain electrode;
32b: a through-hole corresponding to the gate line;
32c: a through-hole corresponding to data line;
30': a planar passivation layer; 34: a pixel electrode;
36: a connection line for the gate line; 38: a connection line for the data line.

The term "forming" mentioned herein shall be understood in a broad sense. For example, it can be performed by means of processes commonly used in the art, such as chemical vapor deposition and molecular beam epitaxy, and so on. Since there are many ways for forming thin films and there are relatively more suitable formation processes for different materials, technical processes for forming each thin film will not be specifically indicated herein, as these processes are not the key points of the invention.

Figure 1:
FIG. 1 illustrates a step of the method for fabricating an array substrate according to an embodiment of the invention.

FIG. 1 illustrates step 1 of the method for fabricating an array substrate according to an embodiment of the invention. Firstly, forming a gate 14 and a gate line 16 on a substrate 12 such as a silicon substrate. The gate line 16 may be used to connect the gates 14 of various transistors in the subsequent procedures. That is to say, prior to forming a metal thin film layer for a source electrode, a drain electrode and a data line, the gate 14 and the gate line 16 are formed on the substrate 12. As for the metal thin film layer for the source electrode, the drain electrode and the data line, it will be further expounded hereinafter.

Figure 2:
FIG. 2 illustrates a step of the method for fabricating an array substrate according to an embodiment of the invention.

Next, as shown in FIG. 2, a gate insulation layer 18 may be formed on the gate 14, the gate line 16 and remaining portions of the substrate 12 not covered by the gate 14 and the gate line 16, i.e., the gate insulation layer 18 covering the gate 14 and gate line 16 is formed. An active layer 20 may be formed on the gate insulation layer 18, which is also above the region of the gate 14, i.e., the active layer 20 covering the gate insulation layer 18 and corresponding to the region of gate 14 may be formed. The active layer 20 may be a metal oxide layer, for example, indium gallium zinc oxide InGaZnO (IGZO), indium tin zinc oxide InSnZnO (ITZO), or nitrogen-doped zinc oxide ZnON, or a semiconductor layer such as non-crystalline silicon (α-silicon).

Figure 3:
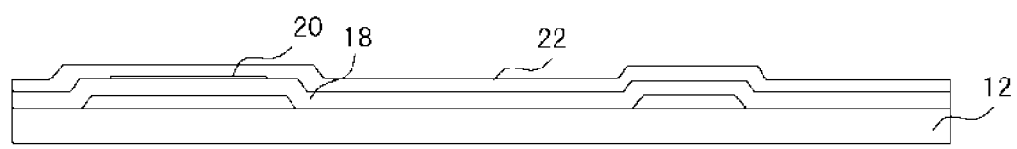
FIG. 3 illustrates a step of the method for fabricating an array substrate according to an embodiment of the invention.

Then, a metal thin film layer 22 for the source electrode, the drain electrode and the data line may be formed on the active layer 20 and the gate insulation layer 18 not covered by the active layer 20, as shown in FIG. 3. The metal thin film layer 22 may be a copper or titanium layer.

Figure 4:
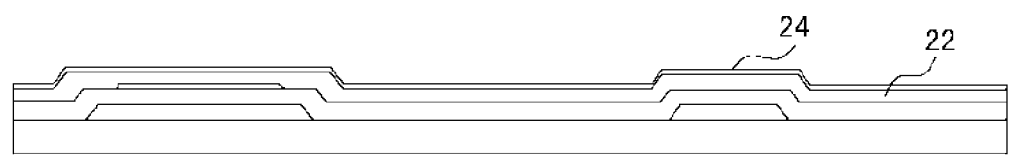
FIG. 4 illustrates a step of the method for fabricating an array substrate according to an embodiment of the invention.

Subsequently, a non-crystalline semiconductor thin film layer 24 may be formed on the metal thin film layer 22, as shown in FIG. 4. The non-crystalline semiconductor thin film layer 24 may be a layer of α-silicon, α-germanium, α-gallium arsenide, α-arsenic sulfide or α-selenium. It is known to a person having ordinary skill in the art that the term "α" denotes an amorphous state. In an embodiment, the thickness of the non-crystalline semiconductor thin film layer 24 may be 10 Å-50 Å.

Figure 5:
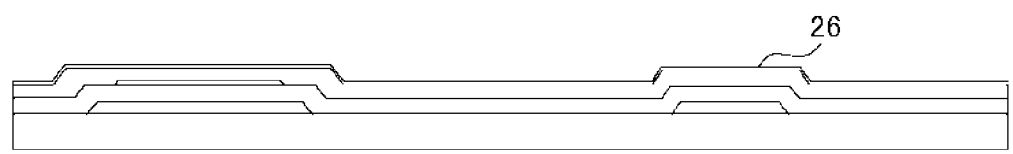
FIG. 5 illustrates a step of the method for fabricating an array substrate according to an embodiment of the invention.

Then, annealing may be performed, so that at least part of the non-crystalline semiconductor thin film layer 24 may be converted into a metal semiconductor compound 26, as shown in FIG. 5. In an embodiment, the metal semiconductor compound 26 may comprise a silicide of copper, a germanide of copper, a compound of copper and α-gallium arsenide, a compound of copper and α-arsenic sulfide, a compound of copper and α-selenium, a silicide of titanium, a germanide of titanium, a compound of titanium and α-gallium arsenide, a compound of titanium and α-arsenic sulfide, and a compound of titanium and α-selenium. In this procedure, the metal thin film layer 22 is in contact with the non-crystalline semiconductor thin film layer 24. Annealing may be carried out at a temperature ranging about between 200° C. and 280° C. During the annealing process at such temperature, Cu atoms in the metal thin film layer 22, such as a Cu layer, would diffuse into the non-crystalline semiconductor thin film layer 24 such as an α-silicon layer, such that Cu atoms and Si atoms bind together to form a silicide of copper, for example, $Cu_5Si$. There is a stronger binding force between Cu and Si. The adhesion of $Cu_5Si$ is very strong such that the binding between Cu and oxygen can be prevented, thereby the problem of corrosion for Cu caused by oxidation can be solved. The annealing process may be carried out under nitrogen atmosphere, so as to form a thicker silicide of copper, for example, $Cu_5Si$.

The metal thin film layer 22 may also be a titanium (Ti) layer. In this case, during the annealing process, Ti atoms in the Ti layer would diffuse into the non-crystalline semiconductor thin film layer 24 such as an α-silicon layer, such that Ti atoms and Si atoms bind together to form a silicide of titanium, for example, titanium silicide $TiSi_2$. Likewise, there is a stronger binding force between Ti and Si. The adhesion of $TiSi_2$ is very strong such that the binding between Ti and oxygen can be prevented, thereby the problem of corrosion for Ti caused by oxidation can be overcomed. The annealing process may be performed under nitrogen atmosphere, so as to form a thicker silicide of titanium, for example, $TiSi_2$.

Since the metal thin film layer 22 may be a layer of copper or titanium, the non-crystalline semiconductor thin film layer 24 may be a layer of α-silicon, α-germanium, α-gallium arsenide, α-arsenic sulfide or α-selenium, accordingly, the metal semiconductor compound 26 formed after annealing may be a silicide of copper, a germanide of copper, a compound of copper and α-gallium arsenide, a compound of copper and α-arsenic sulfide, a compound of copper and α-selenium, a silicide of titanium, a germanide of titanium, a compound of titanium and α-gallium arsenide, a compound of titanium and α-arsenic sulfide, or a compound of titanium and α-selenium. As mentioned above, this is not difficult for a person having ordinary skill in the art to understand.

Figure 6:
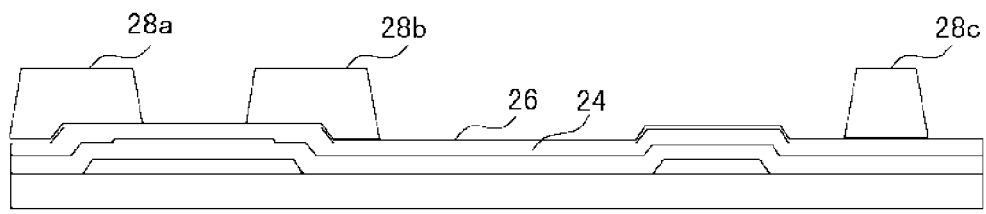
FIG. 6 illustrates a step of the method for fabricating an array substrate according to an embodiment of the invention.

In an embodiment, a photoresist layer may be formed, and the photoresist outside regions of the source electrode, drain electrode and data line may be removed by exposure and development, as shown in FIG. 6. In FIG. 6, after the photoresist outside the regions of the source electrode, the drain electrode and the data line is removed, photoresist 28a corresponding to source electrode, photoresist 28b corresponding to drain electrode and photoresist 28c corresponding to the region of data line are left.

Figure 7:
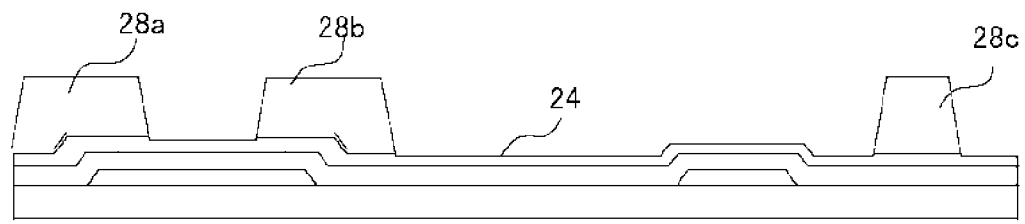
FIG. 7 illustrates a step of the method for fabricating an array substrate according to an embodiment of the invention.

Subsequently, the metal semiconductor compound 26 outside the regions of source electrode, drain electrode and data line may be removed by dry etching, as shown in FIG. 7. As mentioned above, in the case where the metal thin film layer 22 is a copper layer and the non-crystalline semiconductor thin film layer 24 is an α-silicon layer, the metal semiconductor compound 26 formed by annealing is a silicide of copper, for example, $Cu_5Si$. Silicide of copper such as $Cu_5Si$ has a strong resistance to etching agent, and there is a stronger binding force between Cu and Si, hence the oxidation phenomenon for Cu is not prone to occur.

Figure 8:
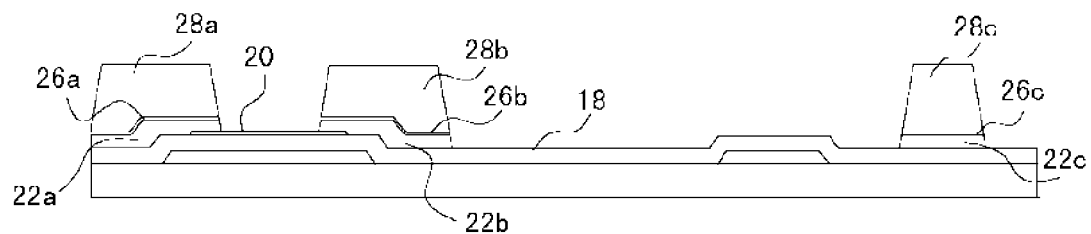
FIG. 8 illustrates a step of the method for fabricating an array substrate according to an embodiment of the invention.

Next, the metal thin film layer 22 such as a layer of Cu outside regions of the source electrode, the drain electrode and the data line may be removed by wet etching, as shown in FIG. 8. In FIG. 8, after the metal thin film layer 22 outside the regions of the source electrode, the drain electrode and the data line is removed, a source electrode 22a, a drain electrode 22b and a data line 22c may be formed from the metal thin film layer 22, and a source metal semiconductor compound layer 26a, a drain metal semiconductor compound layer 26b and a metal semiconductor compound layer 26c for the data line may be formed, which are respectively located above the source electrode 22a, the drain electrode 22b and the data line 22c and in contact with the source electrode 22a, the drain electrode 22b and the data line 22c.

Figure 9:
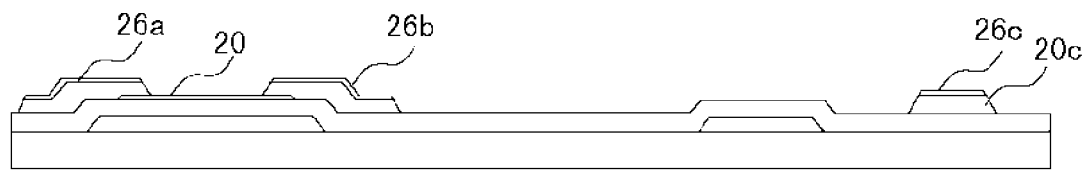
FIG. 9 illustrates a step of the method for fabricating an array substrate according to an embodiment of the invention.

Then, the remaining photoresists may be removed. As shown in FIG. 9, the photoresist 28a, photoresist 28b, and photoresist 28c respectively located above the source metal semiconductor compound layer 26a, drain metal semiconductor compound layer 26b and metal semiconductor compound layer 26c for the data line are removed, thus exposing the source metal semiconductor compound layer 26a, drain metal semiconductor compound layer 26b and metal semiconductor compound layer 26c for the data line.

Figure 10:
FIG. 10 illustrates a step of the method for fabricating an array substrate according to an embodiment of the invention.
Figure 11:
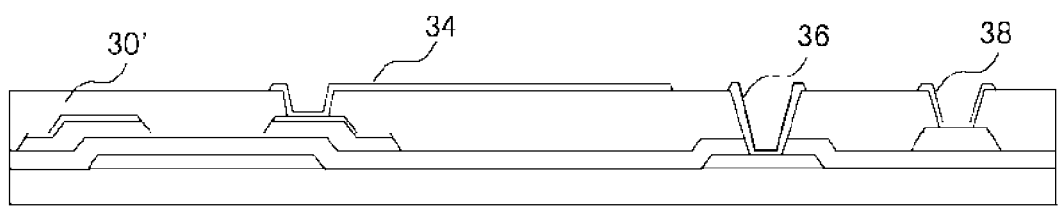
FIG. 11 illustrates a step of the method for fabricating an array substrate according to an embodiment of the invention.

In an embodiment, a passivation layer 30 may be formed, and portions of the passivation layer 30 corresponding to the drain electrode, gate line and data line may be etched to form corresponding through-holes, for example, through-holes 32a, 32b and 32c respectively located at the positions corresponding to the drain electrode, gate line and data line, as shown in FIG. 10. In an embodiment, a via-hole of gate insulation layer may be formed at a position corresponding to the gate line on the gate insulation layer 18. As can be seen from FIG. 10, the through-hole 32b corresponding to gate line may pass through the passivation layer 30 and the gate insulation layer 18, thus directly exposing the gate line 16.

After planarization for the passivation layer 30, i.e., after the passivation layer 30 is changed into a planar passivation layer 30', a transparent conductive thin film may be formed. A pattern including a pixel electrode 34, a connection line 36 for the gate line and a connection line 38 for the data line may be formed on the passivation layer with the through-holes may be formed through a patterning process, and the drain metal semiconductor compound layer 26b may be electrically connected to the pixel electrode 34 by means of the through-hole corresponding to the drain electrode.

With the method for fabricating an array substrate provided by the embodiments of the invention, by at least partly converting the non-crystalline semiconductor thin film layer into a metal semiconductor compound, the resulting metal semiconductor compound may prevent oxidative-corrosion of the metal thin film layer (e.g., a Cu or Ti layer) in the subsequent procedures. By means of such method, metal oxide thin film transistor may be fabricated, and also the oxidation of Cu or Ti at the source electrode or drain electrode can be prevented during the fabrication procedure of the thin film transistor using Cu or Ti. In the prior art, both a heat treatment process and a plasma treatment process may have limitation due to the problem of oxidation of Cu or Ti at the source electrode or drain electrode of a thin film transistor. However, with the method for fabricating an array substrate provided by the embodiments of the invention, such problem can be mitigated or solved, and meanwhile, it is also favorable for the fabrication of a back-channel-etched oxide thin film transistor structure using Cu or Ti.

According to a second aspect of the invention, an array substrate fabricated by using above mentioned method for fabricating an array substrate is provided.

For the array substrate fabricated by using the above mentioned method for fabricating an array substrate, non-crystalline semiconductor thin film layer may be at least partly converted into a metal semiconductor compound, in this way, the resulting metal semiconductor compound may prevent oxidative-corrosion for the surface of the metal thin film layer, such as a low-resistance metal (e.g., Cu or Ti) layer, in the subsequent procedures. However, for the array substrate provided by the embodiment of the invention, such problem can be mitigated or solved, and meanwhile, it is also favorable for the fabrication of a metal oxide thin film transistor using Cu or Ti.

According to a third aspect of the invention, a display device comprising the above mentioned array substrate is provided.

Although the invention has been illustrated with reference to embodiments presently considered, it shall be understood that the invention is not limited to the disclosed embodiments. On the contrary, the invention is intended to cover various modifications and equivalent arrangements within the spirit and scope of the appended claims. The scope of the appended claims accords with the broadest explanations so as to include each modification as such as well as equivalent structures and functions.

The invention claimed is:

1. A method for fabricating an array substrate, comprising:
    forming a metal thin film layer for a source electrode, a drain electrode and a data line;
    forming a non-crystalline semiconductor thin film layer on the metal thin film layer; and
    performing annealing, so as to at least partly convert the non-crystalline semiconductor thin film layer into a metal semiconductor compound,
    wherein the method further comprises:
    forming a photoresist layer;
    removing the photoresist outside regions of the source electrode, drain electrode and data line by exposure and development;
    removing the metal semiconductor compound outside the regions of the source electrode, drain electrode and data line by dry etching, so as to obtain a source metal semiconductor compound layer, a drain metal semiconductor compound layer and a metal semiconductor compound layer for the data line;
    removing the metal thin film layer outside the regions of the source electrode, drain electrode and data line by wet etching, the remaining metal thin film layer being a portion of the source electrode, the drain electrode and the data line respectively, such that each of the source electrode, the drain electrode and the data line is a double-layer structure, the double-layer structure comprising an upper metal thin film layer and a corresponding lower metal semiconductor compound layer; and
    removing a remaining photoresist.

2. The method according to claim 1, further comprising:
    prior to forming the metal thin film layer for the source electrode, the drain electrode and the data line, forming on the substrate a gate and a gate line, a gate insulation layer covering the gate and gate line, and an active layer on the gate insulation layer and corresponding to a region of the gate.

3. The method according to claim 2, further comprising:
    forming a passivation layer, and etching portions of the passivation layer corresponding to the drain electrode, gate line and data line to form corresponding through-holes.

4. The method according to claim 3, further comprising:
    forming a via-hole in the gate insulation layer at a position corresponding to the gate line on the gate insulation layer.

5. The method according to claim 4, further comprising:
    forming a transparent conductive thin film and forming a pattern including a pixel electrode, a connection line for the gate line and a connection line for the data line on the passivation layer with the through-holes through a patterning process, wherein a metal semiconductor compound on the drain electrode is electrically connected to the pixel electrode by means of the through-hole corresponding to the drain electrode.

6. The method according to claim 2, wherein the active layer is a metal oxide layer.

7. The method according to claim 6, wherein the metal oxide layer comprises a semiconductor layer of InGaZnO, InSnZnO or ZnON.

8. The method according to claim 1, wherein the metal thin film layer comprises a layer of copper or titanium.

9. The method according to claim 8, wherein the metal thin film layer comprises a copper layer.

10. The method according to claim 1, wherein the non-crystalline semiconductor thin film layer comprises a layer of α-silicon, α-germanium, α-gallium arsenide, α-arsenic sulfide or α-selenium.

11. The method according to claim 10, wherein the non-crystalline semiconductor thin film layer comprises an α-silicon layer.

12. A method according to claim 1, wherein the metal semiconductor compound comprises a silicide of copper, a germanide of copper, a compound of copper and α-gallium arsenide, a compound of copper and α-arsenic sulfide, a compound of copper and α-selenium, a silicide of titanium, a germanide of titanium, a compound of titanium and α-gallium arsenide, a compound of titanium and α-arsenic sulfide, or a compound of titanium and α-selenium.

13. The method according to claim 12, wherein the metal semiconductor compound comprises a silicide of copper.

14. The method according to claim 1, wherein the thickness of the non-crystalline semiconductor thin film layer is 10 Å-50 Å.

15. The method according to claim 1, wherein a temperature for the annealing ranges between 200° C. and 280° C.

16. The method according to claim 1, wherein the annealing is performed under nitrogen atmosphere.

* * * * *

UNITED STATES PATENT AND TRADEMARK OFFICE
CERTIFICATE OF CORRECTION

PATENT NO. : 9,905,434 B2  
APPLICATION NO. : 15/022288  
DATED : February 27, 2018  
INVENTOR(S) : Seongyeol Yoo et al.

Page 1 of 1

It is certified that error appears in the above-identified patent and that said Letters Patent is hereby corrected as shown below:

On the Title Page

Item (86), PCT/CN2015/087308 should read ---PCT/CN2015/087208---.

Signed and Sealed this
Twenty-eighth Day of July, 2020

Andrei Iancu
*Director of the United States Patent and Trademark Office*